United States Patent
Kim et al.

(10) Patent No.: US 11,013,108 B2
(45) Date of Patent: May 18, 2021

(54) FLEXIBLE SUBSTRATE WITH BUBBLE-PREVENTION LAYER AND DISPLAY DEVICE INCLUDING THE SAME

(71) Applicant: Samsung Display Co., Ltd., Yongin-si (KR)

(72) Inventors: Jeungsoo Kim, Gwangju-si (KR); Yun-ho Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/379,712

(22) Filed: Apr. 9, 2019

(65) Prior Publication Data
US 2019/0394869 A1    Dec. 26, 2019

(30) Foreign Application Priority Data

Jun. 22, 2018  (KR) .................. 10-2018-0071886

(51) Int. Cl.
*G06F 3/044*    (2006.01)
*H05K 1/02*    (2006.01)
(Continued)

(52) U.S. Cl.
CPC ............. *H05K 1/028* (2013.01); *G06F 3/044* (2013.01); *H01L 27/323* (2013.01);
(Continued)

(58) Field of Classification Search
CPC ...... H05K 1/028; H05K 1/0218; H05K 1/189; H05K 2201/10128; H05K 1/0281;
(Continued)

(56) References Cited

U.S. PATENT DOCUMENTS 8,130,356 B2    3/2012  Lee et al.
8,389,863 B2    3/2013  Kim et al.
(Continued)

FOREIGN PATENT DOCUMENTS

EP    2725881    4/2019
KR    10-2008-0000017    1/2008
(Continued)

OTHER PUBLICATIONS

Extended European Search Report dated Dec. 3, 2019, issued in European Patent Application No. 19181684.2.

*Primary Examiner* — Chad M Dicke
(74) *Attorney, Agent, or Firm* — H.C. Park & Associates, PLC

(57) ABSTRACT

A display device including a display module configured to display an image, a printed circuit board provided below the display module, and a flexible substrate including a first bonding region, a bending region, and a second bonding region. The flexible substrate may be bent at the bending region and may be used to connect the display module to the printed circuit board. The flexible substrate may include a circuit layer electrically connecting the display module to the printed circuit board, a cover layer on the circuit layer, and a bubble-prevention layer, which is provided between the cover layer and the circuit layer and is overlapped with each of the first and second bonding regions of the flexible substrate.

26 Claims, 20 Drawing Sheets

(51) Int. Cl.
*H01L 27/32* (2006.01)
*H05K 1/18* (2006.01)
*G02F 1/1333* (2006.01)

(52) U.S. Cl.
CPC ........... *H05K 1/0218* (2013.01); *H05K 1/189* (2013.01); *G02F 1/13338* (2013.01)

(58) Field of Classification Search
CPC ........ H05K 3/281; H05K 3/361; H05K 1/147; G06F 3/044; H01L 27/323; H01L 51/0097; H01L 27/3276; G02F 1/13338
See application file for complete search history.

(56) References Cited

U.S. PATENT DOCUMENTS

| | | | |
|---|---|---|---|
| 8,415,252 B2* | 4/2013 | Cheng | H01L 21/76826 257/759 |
| 9,113,545 B2 | 8/2015 | Han et al. | |
| 10,096,669 B2* | 10/2018 | Yamazaki | G04G 9/0088 |
| 10,115,914 B2* | 10/2018 | Nishimura | H01L 51/5228 |
| 10,153,457 B2* | 12/2018 | Son | H01L 51/5253 |
| 10,177,327 B2* | 1/2019 | Jung | B32B 27/308 |
| 10,254,799 B2* | 4/2019 | Nishikawa | H01L 51/5256 |
| 10,270,059 B2* | 4/2019 | Kim | H01L 51/5253 |
| 10,288,973 B1* | 5/2019 | Gupta | H04M 1/0268 |
| 10,288,974 B2* | 5/2019 | Hou | G06F 1/1637 |
| 10,325,966 B2* | 6/2019 | Isa | H01L 51/003 |
| 10,453,906 B2* | 10/2019 | Nishimura | H01L 23/4985 |
| 10,483,333 B2* | 11/2019 | Zeng | G06F 3/044 |
| 2003/0124341 A1* | 7/2003 | Burroughes | H01L 51/5012 428/332 |
| 2006/0214282 A1 | 9/2006 | Sakata | |
| 2011/0061928 A1 | 3/2011 | Hasegawa | |
| 2013/0034685 A1* | 2/2013 | An | H01L 51/524 428/121 |
| 2014/0078692 A1* | 3/2014 | Park | H05K 7/02 361/749 |
| 2014/0118969 A1 | 5/2014 | Lee | |
| 2014/0217382 A1* | 8/2014 | Kwon | H01L 51/0097 257/40 |
| 2014/0240985 A1 | 8/2014 | Kim et al. | |
| 2017/0146848 A1 | 5/2017 | Park et al. | |
| 2017/0185200 A1* | 6/2017 | Dai | G06F 3/041 |
| 2018/0062094 A1* | 3/2018 | Kwon | H01L 27/323 |
| 2018/0076400 A1 | 3/2018 | Jung et al. | |
| 2018/0138448 A1* | 5/2018 | Jin | H01L 51/5246 |
| 2018/0182829 A1* | 6/2018 | Shin | H01L 27/3244 |
| 2018/0226608 A1* | 8/2018 | Nakagawa | H01L 51/5253 |
| 2018/0233541 A1* | 8/2018 | Zeng | G06F 3/0412 |
| 2018/0246544 A1* | 8/2018 | Kwon | G06F 1/1652 |
| 2018/0348913 A1* | 12/2018 | Lee | G06F 3/044 |
| 2019/0019966 A1* | 1/2019 | Jiang | H01L 51/5253 |
| 2019/0198801 A1* | 6/2019 | Kuon | H01L 51/0097 |

FOREIGN PATENT DOCUMENTS

| | | |
|---|---|---|
| KR | 10-2012-0075165 | 7/2012 |
| KR | 10-1441428 | 9/2014 |
| KR | 10-2018-0029739 | 3/2018 |
| KR | 10-1838736 | 3/2018 |

* cited by examiner

FLEXIBLE SUBSTRATE WITH BUBBLE-PREVENTION LAYER AND DISPLAY DEVICE INCLUDING THE SAME

CROSS REFERENCE TO RELATED APPLICATION

This application claims priority from and the benefit of Korean Patent Application No. 10-2018-0071886, filed on Jun. 22, 2018, which is hereby incorporated by reference for all purposes as if fully set forth herein.

BACKGROUND

Field

Exemplary embodiments of the invention relate generally to a display device, and more specifically, to a flexible substrate with improved durability and a display device including the same.

Discussion of the Background

Recently, there is an increasing demand for thin, small, and light display devices. Accordingly, various studies are being conducted to mount driving devices, which are used to control an image display operation of a display device, in a limited area of the display device.

A flexible printed circuit board is configured to allow the driving devices to be directly mounted thereon and is provided in the form of a tape carrier package (TCP) connecting a printed circuit board mounted with the driving devices to a display panel.

In the case where a circuit pattern formed on the flexible printed circuit board is repeatedly bent and is coupled in a bent state, a crack may occur in the flexible printed circuit board. In some cases, the flexible printed circuit board may be broken by a tensile force caused by the bending operation.

The above information disclosed in this Background section is only for understanding of the background of the inventive concepts, and, therefore, it may contain information that does not constitute prior art.

SUMMARY

Devices constructed according to exemplary embodiments of the inventive concepts provide a flexible substrate with improved durability and a display device including the same.

Additional features of the inventive concepts will be set forth in the description which follows, and in part will be apparent from the description, or may be learned by practice of the inventive concepts.

According to an exemplary embodiment of the inventive concepts, a display device may include a display module configured to display an image, a printed circuit board provided below the display module, and a flexible substrate bent to connect the display module to the printed circuit board. The flexible substrate may include a first bonding region, a bending region, and a second bonding region, which are arranged in a specific direction when viewed in a plan view. The first bonding region may be connected to the display module, and the second bonding region may be connected to the printed circuit board. The bending region may be defined between the first and second bonding regions to connect the first bonding region to the second bonding region. The flexible substrate may include a circuit layer electrically connecting the display module to the printed circuit board, a cover layer provided on the circuit layer, and a bubble-prevention layer provided between the cover layer and the circuit layer and overlapped with each of the first and second bonding regions.

In an exemplary embodiment, the flexible substrate may have a first thickness in each of the first and second bonding regions and may have a second thickness, which is smaller than the first thickness, in at least a portion of the bending region.

In an exemplary embodiment, the bubble-prevention layer may include first portions overlapped with the first and second bonding regions, respectively, and spaced apart from each other with the bending region interposed therebetween, and a second portion provided between the first portions and overlapped with the bending region. The second portion may be thinner than each of the first portions.

In an exemplary embodiment, the cover layer and the circuit layer may be in direct contact with each other in the bending region.

In an exemplary embodiment, the bubble-prevention layer may be not overlapped with the bending region.

In an exemplary embodiment, the bending region may include a maximum stress region, and a thickness of the flexible substrate may be smaller in the maximum stress region than in in other regions of the bending region, except the maximum stress region.

In an exemplary embodiment, the bubble-prevention layer may be overlapped with a region on the flexible substrate, except the maximum stress region.

In an exemplary embodiment, the bubble-prevention layer may include a plurality of bubble-prevention patterns provided in each of the first and second bonding regions.

In an exemplary embodiment, the bubble-prevention patterns may be arranged to have a stripe shape on each of the first and second bonding regions.

In an exemplary embodiment, the bubble-prevention patterns may extend in a direction perpendicular to the specific direction.

In an exemplary embodiment, the bubble-prevention patterns may be arranged in a direction perpendicular to the specific direction.

In an exemplary embodiment, the cover layer may include an electromagnetic interference shielding layer.

In an exemplary embodiment, the cover layer may include a metallic material.

In an exemplary embodiment, the cover layer may include a protection layer protecting the circuit layer.

In an exemplary embodiment, the flexible substrate may include a plurality of flexible substrates. At least one of the plurality of flexible substrates may be configured to provide an input signal, which is provided to the display module from an outside of the display module, to the printed circuit board.

In an exemplary embodiment, the display module may include a display layer including a plurality of organic light emitting devices, and an input sensing layer provided on the display layer, the input sensing layer including a plurality of sensing electrodes, which is used to sense the input signal. The flexible substrates may be arranged side-by-side on a same surface of the display module.

In an exemplary embodiment, the display module may include a display panel configured to display the image and an input sensing panel provided on the display panel. The input sensing panel may include a plurality of sensing electrodes, which are used to sense the input signal.

In an exemplary embodiment, the plurality of flexible substrate may include a first flexible substrate connecting the display panel to the printed circuit board and a second flexible substrate connecting the input sensing panel to the printed circuit board.

In an exemplary embodiment, a thickness of the bubble-prevention layer ranges from about 25 μm to about 35 μm.

In an exemplary embodiment, a thickness of the cover layer ranges from about 25 μm to about 35 μm.

According to an exemplary embodiment of the inventive concepts, a display device may include a display module configured to display an image, a printed circuit board provided below the display module, and a flexible substrate whose two opposite ends may be connected to the display module and the printed circuit board, respectively. The flexible substrate may include a circuit layer having two opposite ends, which are in contact with the display module and the printed circuit board, respectively, thereby connecting the display module electrically to the printed circuit board, a bubble-prevention layer provided on the two opposite ends of the circuit layer, and a cover layer provided on the circuit layer and the bubble-prevention layer to cover the circuit layer and the bubble-prevention layer. At least a portion of the flexible substrate positioned between the two opposite ends of the flexible substrate may be bent, and a thickness of the bent portion of the flexible substrate may be smaller than a thickness of each of the two opposite ends of the flexible substrate.

In an exemplary embodiment, the bubble-prevention layer may be configured to increase an adhesion strength between the circuit layer and the cover layer.

In an exemplary embodiment, the bubble-prevention layer may include a fine pattern formed on a surface of the bubble-prevention layer.

According to an exemplary embodiment of the inventive concepts, a display device include a display module configured to display an image, a printed circuit board provided below the display module, and a flexible substrate connecting the display module to the printed circuit board. The flexible substrate may include at least one bent portion. The flexible substrate may include a circuit layer including a plurality of signal lines, a bubble-prevention layer including a pair of patterns, which are provided at two opposite ends of the flexible substrate and are spaced apart from each other, and a cover layer provided on the circuit layer and the bubble-prevention layer to cover the circuit layer and the bubble-prevention layer.

In an exemplary embodiment, the circuit layer and the cover layer may be in direct contact with each other, in the at least one bent portion of the flexible substrate.

In an exemplary embodiment, the cover layer may include a metallic material.

According to an exemplary embodiment of the inventive concepts, a flexible substrate include a circuit layer including a plurality of signal lines and having a flexible property, a cover layer on the circuit layer, and a bubble-prevention layer between the cover layer and the circuit layer. The circuit layer may include bonding regions, which are electrically coupled to a printed circuit board or driving devices, and a bending region, which is at least partially bent. The bubble-prevention layer may be provided on the bonding regions, and a thickness of the flexible substrate may be greater in the bonding regions than in the bending region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
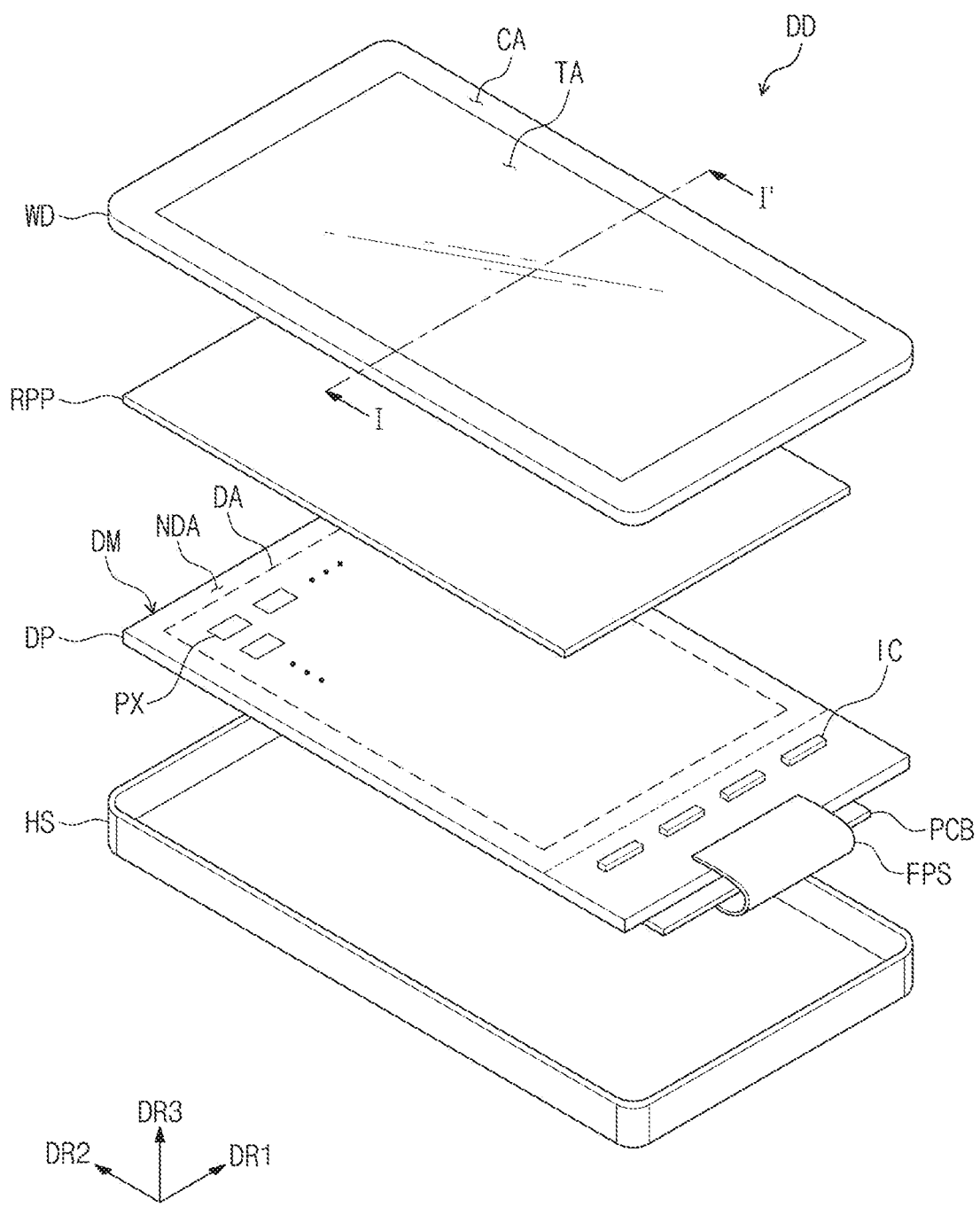
FIG. 1 is an exploded perspective view of a display device according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
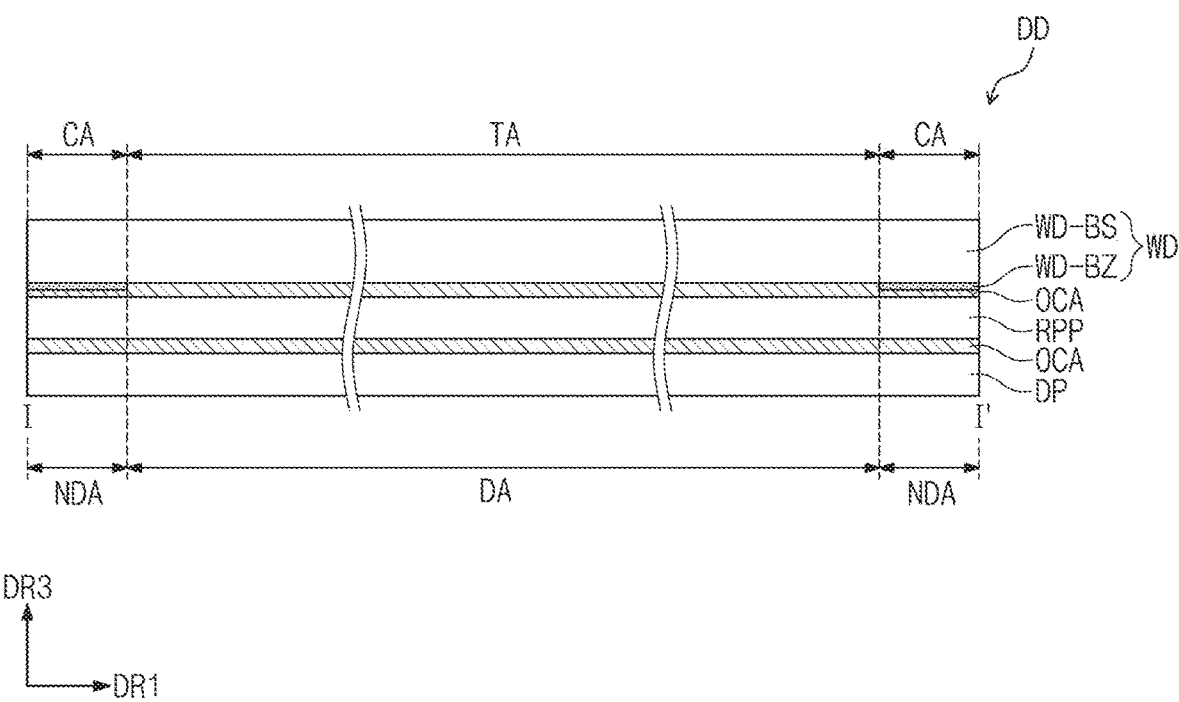
FIG. 2 is a sectional view taken along line I-I' of FIG. 1.

FIG. 1 is an exploded perspective view of a display device according to an exemplary embodiment of the inventive concepts, and FIG. 2 is a sectional view taken along line I-I' of FIG. 1. A section of a display device defined by a first direction DR1 and a third direction DR3 is illustrated in FIG. 2. In order to reduce complexity in the drawings and to provide better understanding of the inventive concepts, a stacking structure of functional panel and/or units constituting a display device DD is schematically illustrated in FIG. 2. For example, some elements (e.g., a housing HS, a printed circuit board PCB, and a flexible substrate FPS) of the display device DD are omitted from FIG. 2.

Referring to FIGS. 1 and 2, the display device DD may have short sides parallel to the first direction DR1 and may have long sides parallel to a second direction DR2 perpendicular to the first direction DR1. However, the shape of the display device DD is not limited to this example.

The display device DD may be configured to provide a display surface that is parallel to both of the first and second directions DR1 and DR2 and is used to display an image in the third direction. The display surface, on which the image is displayed, may correspond to a front surface of the display device DD.

Hereinafter, the third direction DR3 may be used to differentiate a front or top surface of each element from a back or bottom surface. However, directions indicated by the first to third directions DR1, DR2, and DR3 may not be limited to this example, and, in certain embodiments, they may be changed to indicate other directions.

The display device DD may include a window member WD, a display module DM, an anti-reflection panel RPP, a printed circuit board PCB, a flexible substrate FPS, and a housing HS. The display module DM, the anti-reflection panel RPP, and the window member WD may be coupled to each other by an optically clear adhesive layer OCA (FIG. 2).

The window member WD may include a transmission region TA, which is configured to allow an image light, which is provided from the display module DM, to pass therethrough, and a light-blocking region CA, which is adjacent to the transmission region TA and is configured to prevent the image light from passing therethrough. When viewed in a plane defined by the first and second directions DR1 and DR2, the transmission region TA may be overlapped with a center region of the display device DD. The transmission region TA may be a region allowing an image to pass therethrough. A user may see an image passing through the transmission region TA.

The light-blocking region CA may be defined around the transmission region TA to have a frame shape enclosing the transmission region TA. The light-blocking region CA may have a predetermined color. The shape of the transmission region TA may be substantially defined by the light-blocking region CA.

However, the inventive concepts are not limited to this example. In an exemplary embodiment, only the transmission region TA may be defined in the window member WD, and in this case, the light-blocking region CA may be omitted. In other words, the display device DD may be configured to allow the image light to pass through the entire top surface thereof.

As illustrated in FIG. 2, the window member WD may include a base film WD-BS and a light-blocking pattern WD-BZ. The base film WD-BS may include a glass substrate and/or a synthetic resin film. In an exemplary embodiment, the base film WD-BS may not be limited to a single-layered structure. For example, the base film WD-BS may include two or more films that are bonded to each other by an adhesive film.

The light-blocking pattern WD-BZ may be overlapped with the light-blocking region CA. The light-blocking pattern WD-BZ may be a colored organic layer. For example, the light-blocking pattern WD-BZ may be formed by, for example, a coating method.

Although not shown, the window member WD may further include at least one functional coating layer provided on the front surface of the base film WD-BS. The functional coating layer may include an anti-fingerprint layer, an anti-reflection layer, a hard coating layer, and so forth.

The display module DM may be provided below the window member WD. In the present exemplary embodiment, the display module DM may include a display panel DP. In FIG. 2, the display module DM of FIG. 1 is illustrated as the display panel DP.

The display panel DP may be an organic light emitting display panel or an organic electro-luminescence display panel. For example, the display panel DP may include a plurality of organic light emitting devices for the pixels. However, the inventive concepts are not limited to a kind of the display panel DP. For example, the display panel DP may be a liquid crystal display panel, an electrowetting display panel, a nano-crystal display panel, or a quantum-dot light-emitting display panel. The description that follows will refer to an example of the present exemplary embodiment in which the display panel DP is an organic light emitting display panel.

When viewed in a plan view, the display panel DP may include a display region DA and a non-display region NDA. The display region DA may correspond to the transmission region TA of the window member WD.

The display region DA may be used to display an image. For example, the display panel DP may include a plurality of pixels PX, which are provided on the display region DA to emit lights constituting an image. The pixels PX may be arranged in a matrix shape on the display region DA. Each of the pixels PX may be configured to emit light, when an electrical signal is applied thereto. This will be described in more detail below.

The non-display region NDA may have a frame shape enclosing the display region DA. The non-display region NDA may correspond to the light-blocking region CA of the window member WD. The non-display region NDA may include a pad region, which is defined in an edge region of the non-display region NDA. The pad region may be connected to the printed circuit board PCB. The display panel DP may be electrically connected to an external device through the pad region. This will be described in more detail with reference to FIG. 3.

The anti-reflection panel RPP may be provided between the window member WD and the display module DM. The anti-reflection panel RPP may be configured to reduce reflectance of an external light, which is incident through a top surface of the window member WD.

Although not shown, in an exemplary embodiment, the anti-reflection panel RPP may include a phase retarder and a polarizer. The phase retarder may be of a film type or a liquid crystal coating type and may include a λ/2 and/or λ/4 phase retarder. The polarizer may also be of a film type or a liquid crystal coating type. The polarizer of the film type may include an elongated synthetic resin film, whereas the polarizer of the liquid crystal coating type may include liquid crystals arranged with a specific orientation. The anti-reflection panel RPP may further include a protection film, in addition to the phase retarder and the polarizer. However, the inventive concepts are not limited to a material of the phase retarder.

Although not shown, the anti-reflection panel RPP may further include a plurality of color filters and a black matrix adjacent to the color filters.

The printed circuit board PCB may be provided below the display module DM. A plurality of driving devices for driving the display module DM may be mounted on the printed circuit board PCB. In addition, at least one driving device may be mounted on the flexible substrate FPS to be described below, and moreover, driving devices IC may be mounted on the non-display region NDA of the display panel DP, as shown in FIG. 1.

The flexible substrate FPS may be configured to connect the display module DM to the printed circuit board PCB. For example, the flexible substrate FPS may connect the display module DM electrically to the printed circuit board PCB. As an example, an end of the flexible substrate FPS may be connected to an opposite end of the display module DM, and an opposite end of the flexible substrate FPS may be connected to the printed circuit board PCB. At least a portion of the flexible substrate FPS may have a bendable property.

In the present exemplary embodiment, the display device DD including one flexible substrate FPS is described as an example, but the inventive concepts are not limited to the number of the flexible substrate FPS. For example, in certain embodiments, a plurality of flexible substrates FPS may be used to connect the display module DM to the printed circuit board PCB.

Hereinafter, the flexible substrate FPS will be described in more detail with reference to FIGS. 5 to 10.

The housing HS may be placed at the lowermost level of the display device DD and may be coupled to the window member WD to contain the anti-reflection panel RPP, the display module DM, the printed circuit board PCB, and the flexible substrate FPS. The housing HS may be formed of or include at least one of plastic or metallic materials. In an exemplary embodiment, the housing HS may be omitted.

Figure 3:
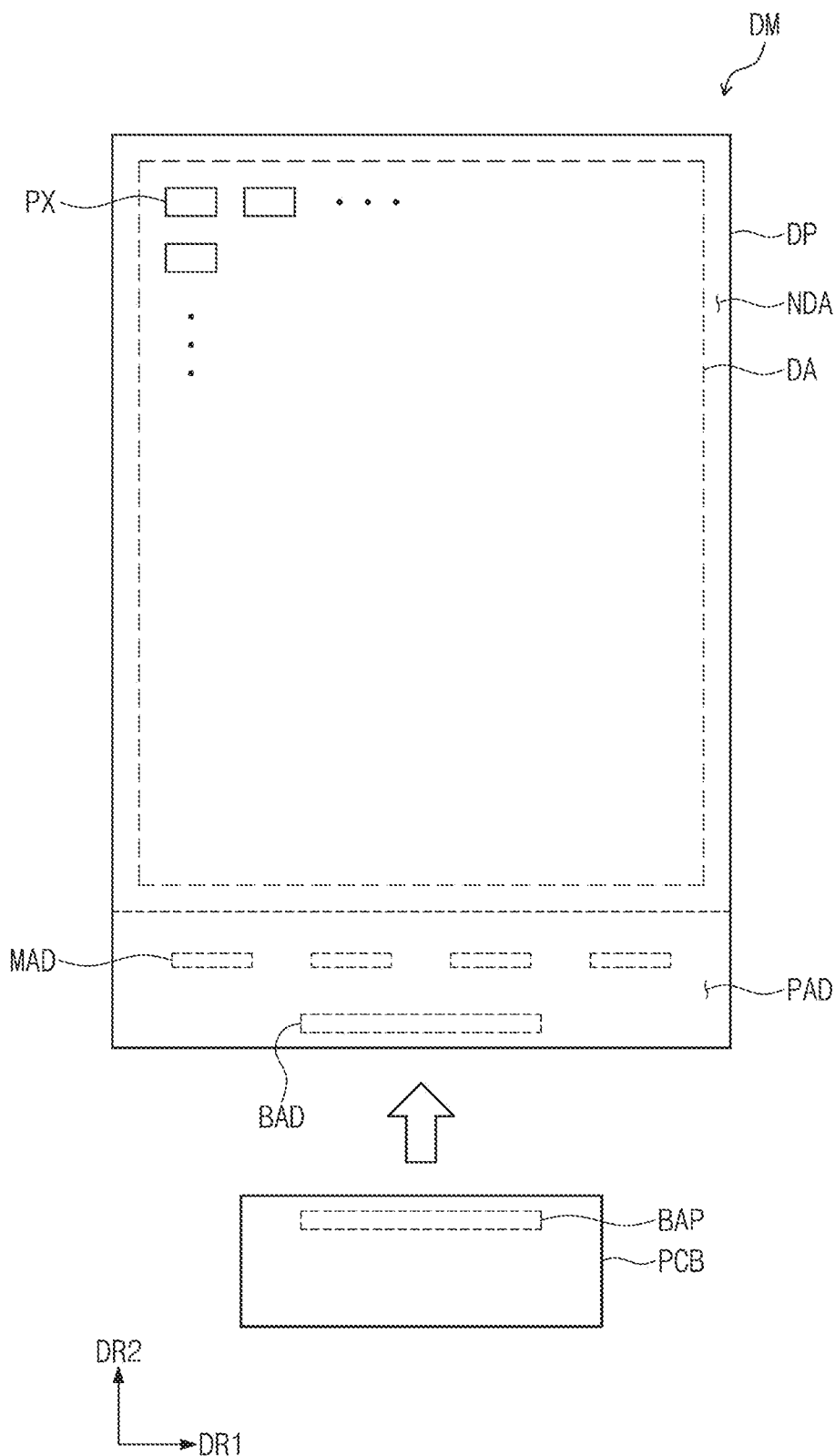
FIG. 3 is a plan view illustrating a display module and a printed circuit board, according to an exemplary embodiment of the inventive concepts.

FIG. 3 is a plan view illustrating a display module and a printed circuit board, according to an exemplary embodiment of the inventive concepts.

Referring to FIG. 3, as described above, the non-display region NDA of the display panel DP may include a pad region PAD, which is provided in an edge region of the non-display region NDA in the second direction DR2. Although not shown, a plurality of signal lines may be provided in the pad region PAD. The pad region PAD may include at least one mount region MAD, on which the driving devices IC (e.g., see FIG. 1) are mounted, and a panel pad region BAD, to which the flexible substrate FPS (e.g., see FIG. 1) is coupled. The display panel DP may be electrically connected to an external device through the mount region MAD and the panel pad region BAD. Although not shown, a plurality of pad electrodes may be provided in the mount region MAD and the panel pad region BAD.

The printed circuit board PCB may be provided to have a substrate pad region BAP. The substrate pad region BAP may be coupled to the flexible substrate FPS (e.g., see FIG. 1). The printed circuit board PCB may be electrically connected to the display panel DP through the substrate pad region BAP. Although not shown, a plurality of pad electrodes may be provided in the substrate pad region BAP. In addition, in the case where, as described above, the driving devices are mounted on the printed circuit board PCB, a mount region may be further defined in the printed circuit board PCB.

Figure 4:
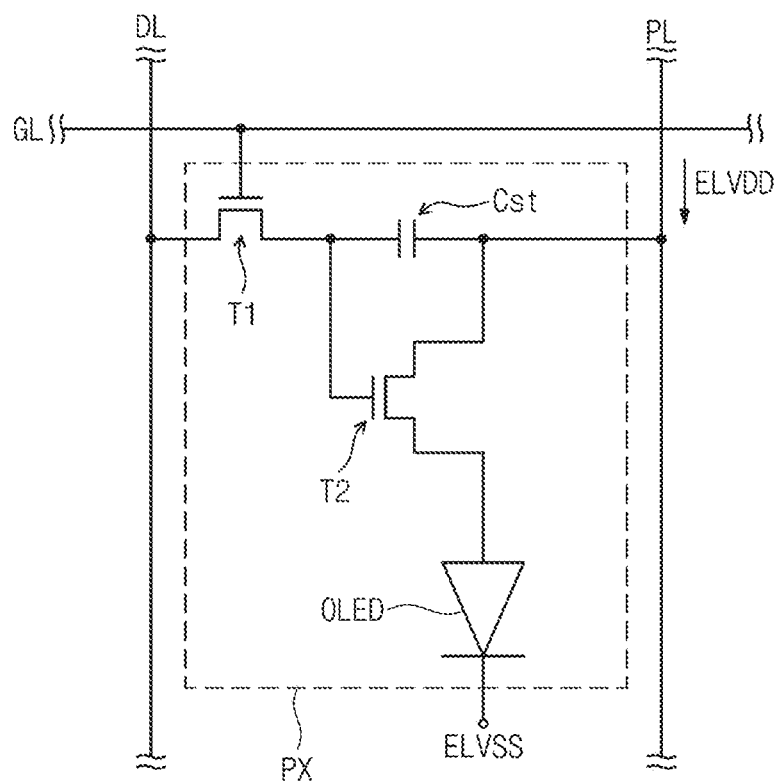
FIG. 4 is an equivalent circuit diagram illustrating a pixel according to an exemplary embodiment of the inventive concepts.

FIG. 4 is an equivalent circuit diagram illustrating a pixel according to an exemplary embodiment of the inventive concepts.

For convenience in illustration, an equivalent circuit diagram of one of the pixels PX of FIGS. 1 and 3 is illustrated in FIG. 4. Each of the pixels PX according to an exemplary embodiment of the inventive concepts may have a structure corresponding to the pixel PX of FIG. 4. However, the structure of the pixel PX is not limited to that shown in FIG. 4, and in certain embodiments, it may be variously changed.

Referring to FIG. 4, the pixel PX may include a first or switching transistor T1, a second or driving transistor T2, and a capacitor Cst, which are used as a pixel driving circuit for driving the organic light emitting diode OLED. A first power voltage ELVDD may be provided to the second transistor T2, and a second power voltage ELVSS may be provided to the organic light emitting diode OLED. The second power voltage ELVSS may be lower than the first power voltage ELVDD.

If a scan signal is applied to a scan line GL, the first transistor T1 may output a data signal applied to a data line DL in response to the scan signal. The capacitor Cst may be charged to have a voltage corresponding to the data signal, which is transmitted from the first transistor T1. The second transistor T2 may be connected to the organic light emitting diode OLED. The second transistor T2 may control a driving current flowing through the organic light emitting diode OLED, based on an amount of charges stored in the capacitor Cst.

The equivalent circuit of FIG. 4 is just one of various possible equivalent circuits of the pixel, and the inventive concepts are not limited thereto. The pixel PX may further include at least one transistor or at least one capacitor. In certain exemplary embodiments, the organic light emitting diode OLED may be provided between and coupled to a power line PL and the second transistor T2.

Figure 5:
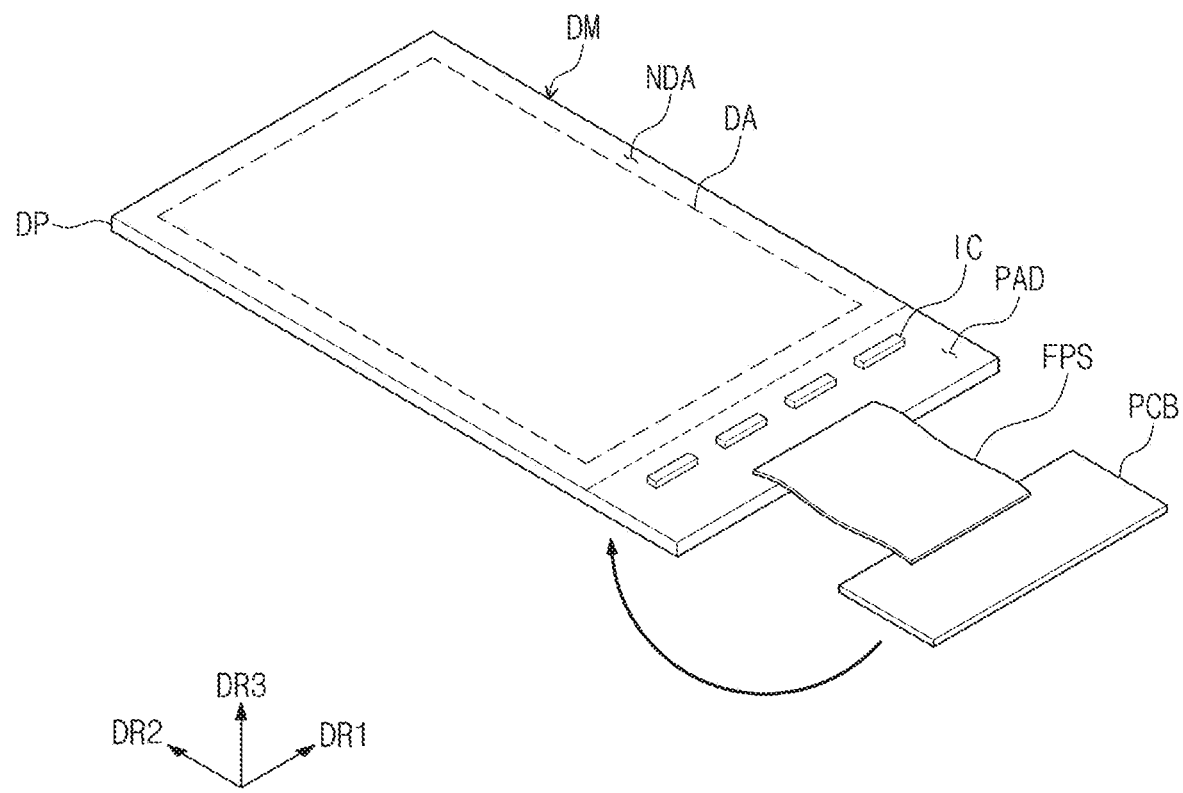
FIG. 5 is a perspective view illustrating a display module and a printed circuit board, according to an exemplary embodiment of the inventive concepts.
Figure 6:
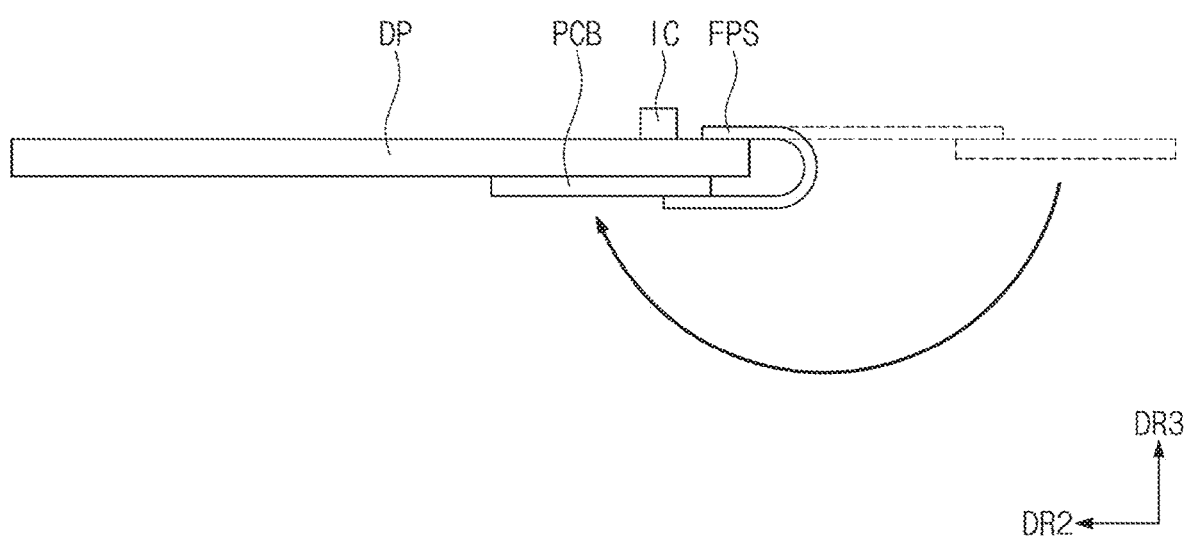
FIG. 6 is a sectional view illustrating a display module and a printed circuit board according to an exemplary embodiment of the inventive concepts.
Figure 7:
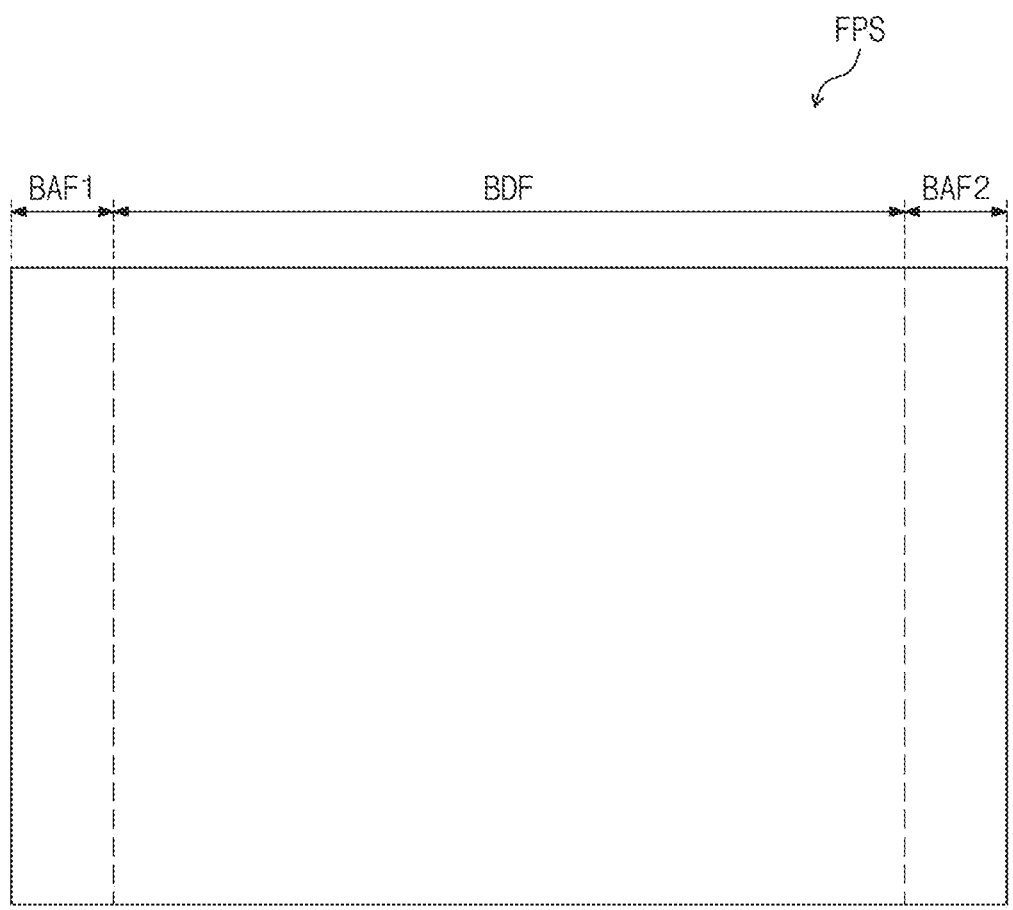
FIG. 7 is a plan view illustrating a flexible substrate according to an exemplary embodiment of the inventive concepts.

FIG. 5 is a perspective view illustrating a display module and a printed circuit board, according to an exemplary embodiment of the inventive concepts, and FIG. 6 is a sectional view illustrating a display module and a printed circuit board, according to an exemplary embodiment of the inventive concepts. FIG. 7 is a plan view illustrating a flexible substrate according to an exemplary embodiment of the inventive concepts.

Referring to FIGS. 5 to 7, according to an exemplary embodiment of the inventive concepts, the flexible substrate FPS may include a plurality of regions. For example, as shown in FIG. 7, the flexible substrate FPS may include a first bonding region BAF1, a bending region BDF, and a second bonding region BAF2. The first bonding region BAF1, the bending region BDF, and the second bonding region BAF2 may be sequentially arranged in the second direction DR2.

The first bonding region BAF1 may be provided in an edge region of the flexible substrate FPS in the second direction DR2. In the present exemplary embodiment, the first bonding region BAF1 of the flexible substrate FPS may be directly connected to the display panel DP. For example, the first bonding region BAF1 of the flexible substrate FPS may be bonded to the panel pad region BAD (e.g., see FIG. 3) described above.

The second bonding region BAF2 may be provided in an opposite edge region of the flexible substrate FPS in the second direction DR2. In the present exemplary embodiment, the second bonding region BAF2 of the flexible substrate FPS may be directly connected to the printed circuit board PCB. For example, the second bonding region BAF2 of the flexible substrate FPS may be bonded to the substrate pad region BAP (e.g., see FIG. 3) described above.

The bending region BDF may be provided between the first and second bonding regions BAF1 and BAF2 to connect the first bonding region BAF1 to the second bonding region BAF2. The bending region BDF may have a bendable property. In the case where the printed circuit board PCB, which is connected to the display panel DP by the flexible substrate FPS, is placed below the display panel DP, the bending region BDF of the flexible substrate FPS may be bent.

In an exemplary embodiment, a ratio in area of each of the first bonding region BAF1, the second bonding region BAF2, and the bending region BDF to the flexible substrate FPS may not be limited to a specific value.

Figure 8:
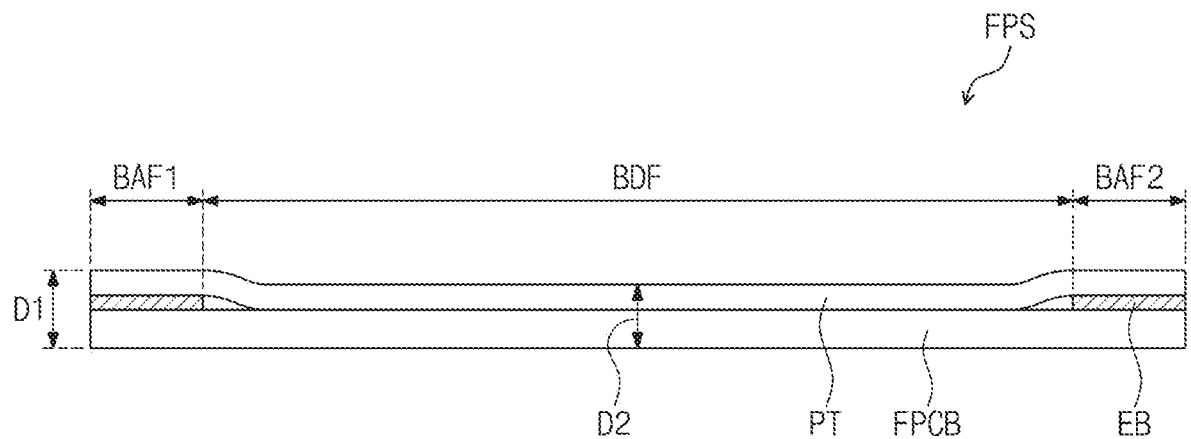
FIG. 8 is a sectional view of the flexible substrate of FIG. 7.
Figure 9:
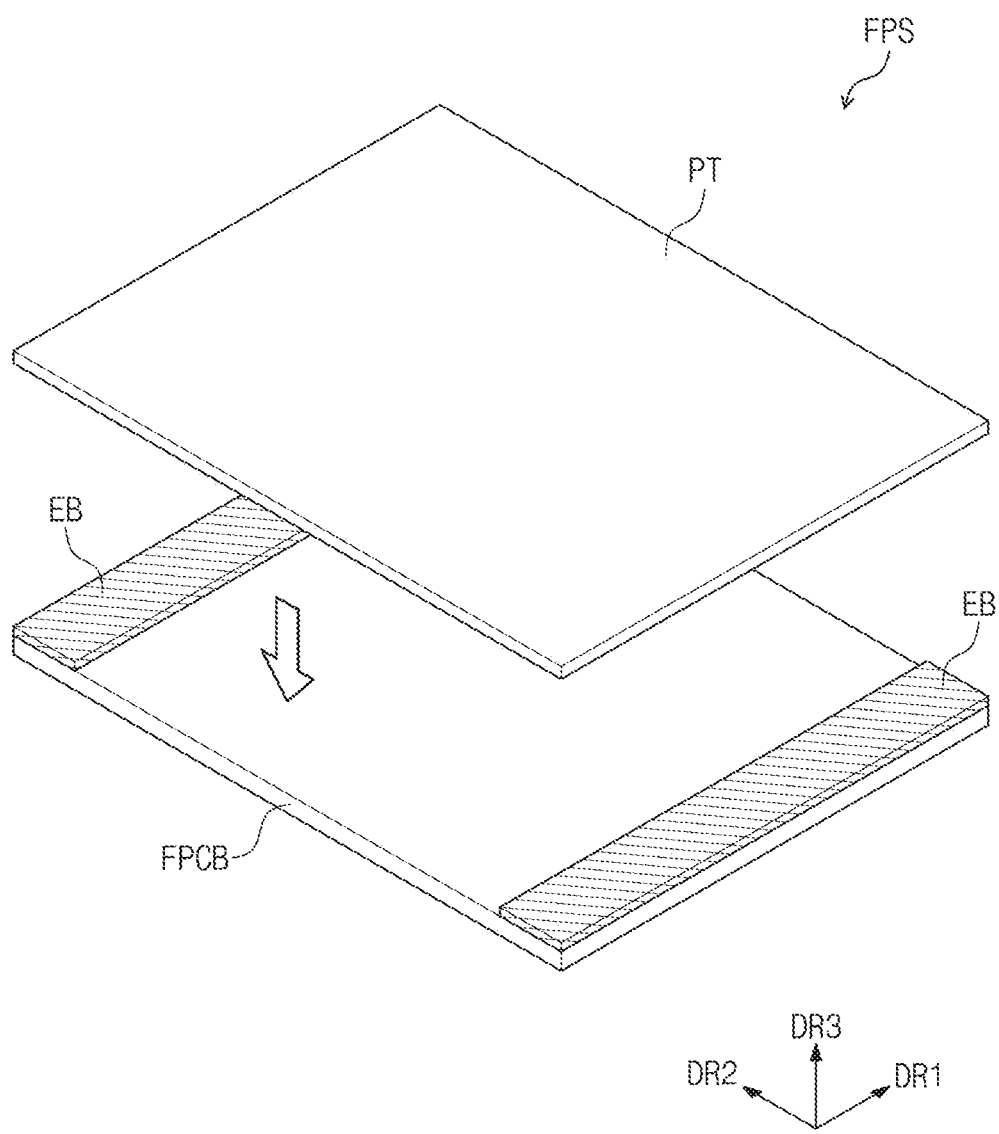
FIG. 9 is an exploded perspective view of the flexible substrate of FIG. 7.

FIG. 8 is a sectional view of the flexible substrate of FIG. 7, and FIG. 9 is an exploded perspective view of the flexible substrate of FIG. 7.

Referring to FIGS. 8 and 9 in conjunction with FIG. 7, the flexible substrate FPS may include a circuit layer FPCB, a bubble-prevention layer EB, and a cover layer PT, which are sequentially stacked in a vertical direction (e.g., the third direction DR3).

The circuit layer FPCB may define a bottom surface of the flexible substrate FPS. Although not illustrated in the drawings, the circuit layer FPCB may include a plurality of signal lines. In each of the first and second bonding regions BAF1 and BAF2, the circuit layer FPCB may be in direct contact with the display panel DP or the printed circuit board PCB. The circuit layer FPCB may be provided to have flexibility. In the present exemplary embodiment, the circuit layer FPCB may be a flexible printed circuit board.

The bubble-prevention layer EB may be provided on the circuit layer FPCB. The bubble-prevention layer EB may be overlapped with each of the first and second bonding regions BAF1 and BAF2 and may be in direct contact with a top surface of the circuit layer FPCB, in each of the first and second bonding regions BAF1 and BAF2. In the present exemplary embodiment, the bubble-prevention layer EB may have a pair of patterns, which have shapes corresponding to respective ones of the first and second bonding regions BAF1 and BAF2.

In the present exemplary embodiment, the bubble-prevention layer EB may not be overlapped with the bending region BDF. For example, the bubble-prevention layer EB may include a plurality of first portions, and in an exemplary embodiment, the first portions may be provided to have a one-to-one relation with the first and second bonding regions BAF1 and BAF2. The first portions may be spaced apart from each other with the bending region BDF interposed therebetween.

The bubble-prevention layer EB may include a fine pattern that is formed on at least one surface of top and bottom surfaces of the bubble-prevention layer EB. For example, a surface of the fine pattern may be shaped like that of a wrinkled tape. For example, the fine pattern may include a plurality of protrusions protruding from a surface of the bubble-prevention layer EB or a plurality of dents or grooves formed on the surface of the bubble-prevention layer EB. The fine pattern may be formed on the surface of the bubble-prevention layer EB by a space defined by gaps, dents, or grooves between the protrusions. In the case where a bubble is produced between the circuit layer FPCB and the cover layer PT, the bubble may be moved along the fine pattern and thereby may exhausted to the outside. In other words, the fine pattern may be used to remove a bubble from a space between the circuit layer FPCB and the cover layer PT. That is, due to the presence of the bubble-prevention layer EB, it may be possible to increase an adhesion strength between the circuit layer FPCB and the cover layer PT.

The cover layer PT may be provided on the bubble-prevention layer EB. The cover layer PT may be provided to cover a top surface of the bubble-prevention layer EB in the first and second bonding regions BAF1 and BAF2 and to cover the top surface of the circuit layer FPCB in the bending region BDF. In other words, the cover layer PT and the circuit layer FPCB may be in direct contact with each other in the bending region BDF.

In the present exemplary embodiment, the cover layer PT may include an electromagnetic interference (EMI) shielding layer. For example, the cover layer PT may be formed of or include a metallic material. As an example, the cover layer PT may include copper (Cu). However, inventive concepts are not limited to a specific function and a specific material of the cover layer PT. In an exemplary embodiment, the cover layer PT may include a protection layer, which is configured to protect the top surface of the circuit layer FPCB.

As described above, the bubble-prevention layer EB may not be overlapped with the bending region BDF. This may lead to a height difference between the first and second bonding regions BAF1 and BAF2 and the bending region BDF. The height difference may correspond to a thickness of the bubble-prevention layer EB.

Figure 10:
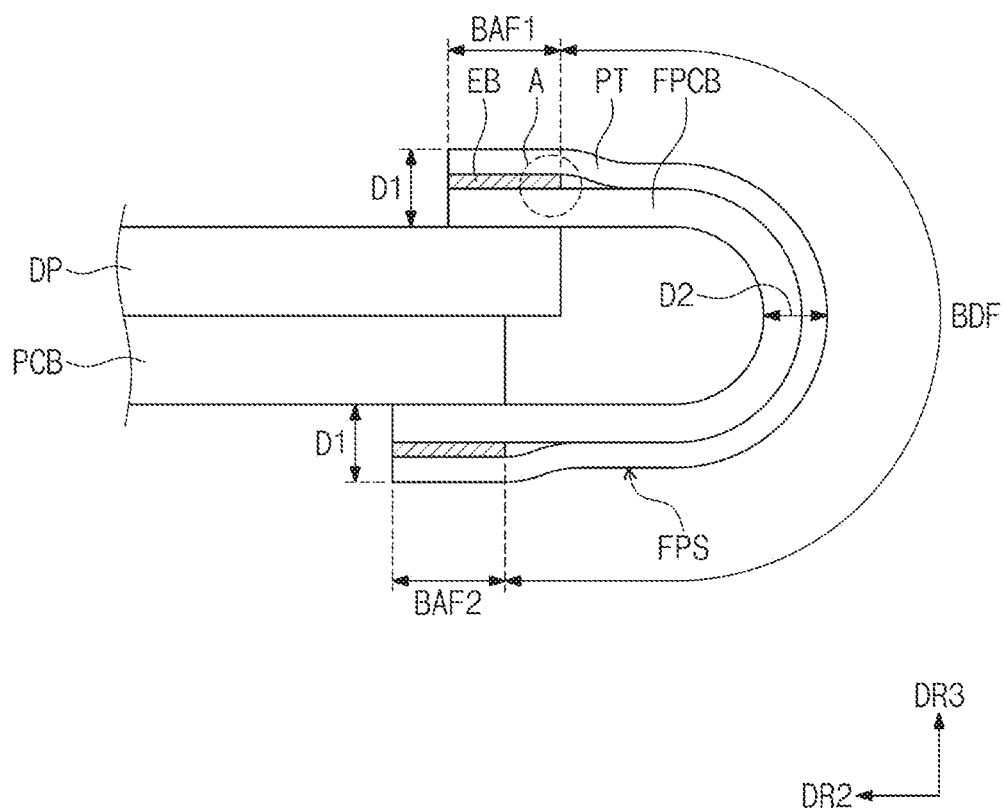
FIG. 10 is a sectional view illustrating a bent shape of a flexible substrate according to an exemplary embodiment of the inventive concepts.

FIG. 10 is a sectional view illustrating a bent shape of a flexible substrate according to an exemplary embodiment of the inventive concepts.

Referring to FIG. 10 in conjunction with FIG. 8, the flexible substrate FPS according to an exemplary embodiment of the inventive concepts may have a first thickness D1 in each of the first and second bonding regions BAF1 and BAF2 and a second thickness D2 in the bending region BDF. In the present exemplary embodiment, a thickness of the flexible substrate FPS overlapped with the bending region BDF may be constant. A difference between the first and second thicknesses D1 and D2 may correspond to a thickness of the bubble-prevention layer EB. For example, the thickness of the bubble-prevention layer EB may range from about 25 μm to about 35 μm. The thickness of the cover layer PT may range from about 25 µm to about 35 µm. The thickness of the circuit layer FPCB may range from about 50 µm to about 60 µm.

In general, if the flexible substrate FPS is bent, a bending stress may be exerted on the bending region BDF of the flexible substrate FPS. In the case where, unlike that in exemplary embodiments of the inventive concepts, the flexible substrate FPS has the second thickness D2 in the bending region BDF, the cover layer PT of the flexible substrate FPS or a bonding structure between the cover layer PT and the bubble-prevention layer EB may be delaminated or exfoliated from the circuit layer FPCB, due to a bending stress. Alternatively, the flexible substrate FPS may be delaminated from the display panel DP or the printed circuit board PCB. This may lead to deterioration in durability of the flexible substrate FPS. For example, in the case where the flexible substrate FPS has the second thickness D2 in the bending region BDF, a stress exerted on a region A between the bending region BDF and the first bonding region BAF1 may be greater than or equal to about 30 MPa. However, according to some exemplary embodiments of the inventive concepts, since a thickness of the flexible substrate FPS is reduced in the bending region BDF, on which the bending stress is exerted, it may be possible to reduce a bending stress exerted on the bending region BDF. Thus, it may be possible to improve durability of the flexible substrate FPS. For example, in the case where the thickness of the flexible substrate FPS is reduced, a stress, which is exerted on the region A between the bending region BDF and the first bonding region BAF1, may be less than or equal to about 14 MPa. In this case, it may be possible to reduce or prevent the cover layer PT of the flexible substrate FPS or the bonding structure between the cover layer PT and the bubble-prevention layer EB from being delaminated from the circuit layer FPCB or to reduce or prevent the flexible substrate FPS from being delaminated from the display panel DP or the printed circuit board PCB. In the present exemplary embodiment, the bubble-prevention layer EB may be applied to the bending region BDF of the tetragonal or rectangular flexible substrate FPS bent between the display panel DP and the printed circuit board PCB, but the inventive concepts are not limited to this example. In an exemplary embodiment, the flexible substrate FPS may be provided to have a plurality of branches, allowing for connection with another driving board or another driving device, and in this case, at least one of ends of the branches may be connected to the another driving board or the another driving device. Here, in the case where the branches are bent, a bending region BDF may be additionally defined on the flexible substrate FPS, and the afore-described structure of the bubble-prevention layer EB may be applied to the additional bending region BDF.

Figure 11:
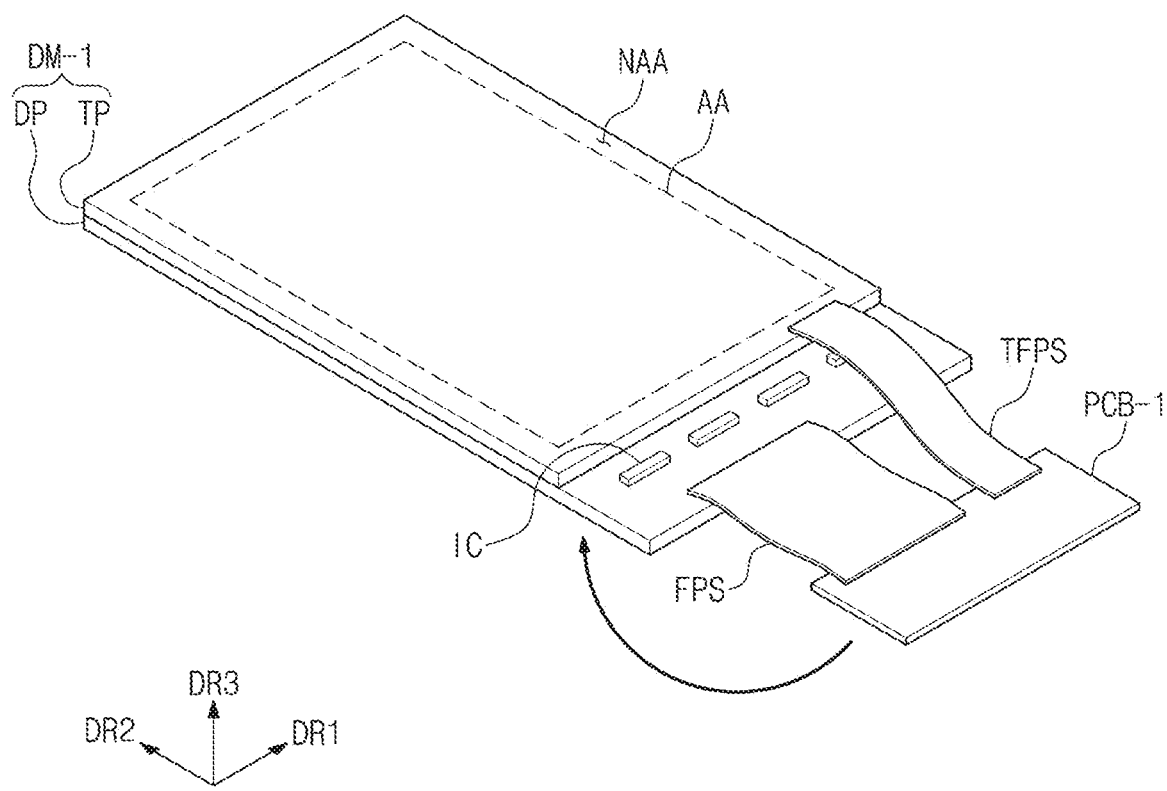
FIGS. 11 and 12 are perspective views, each of which illustrates a display module and a printed circuit board, according to an exemplary embodiment of the inventive concepts.
Figure 12:
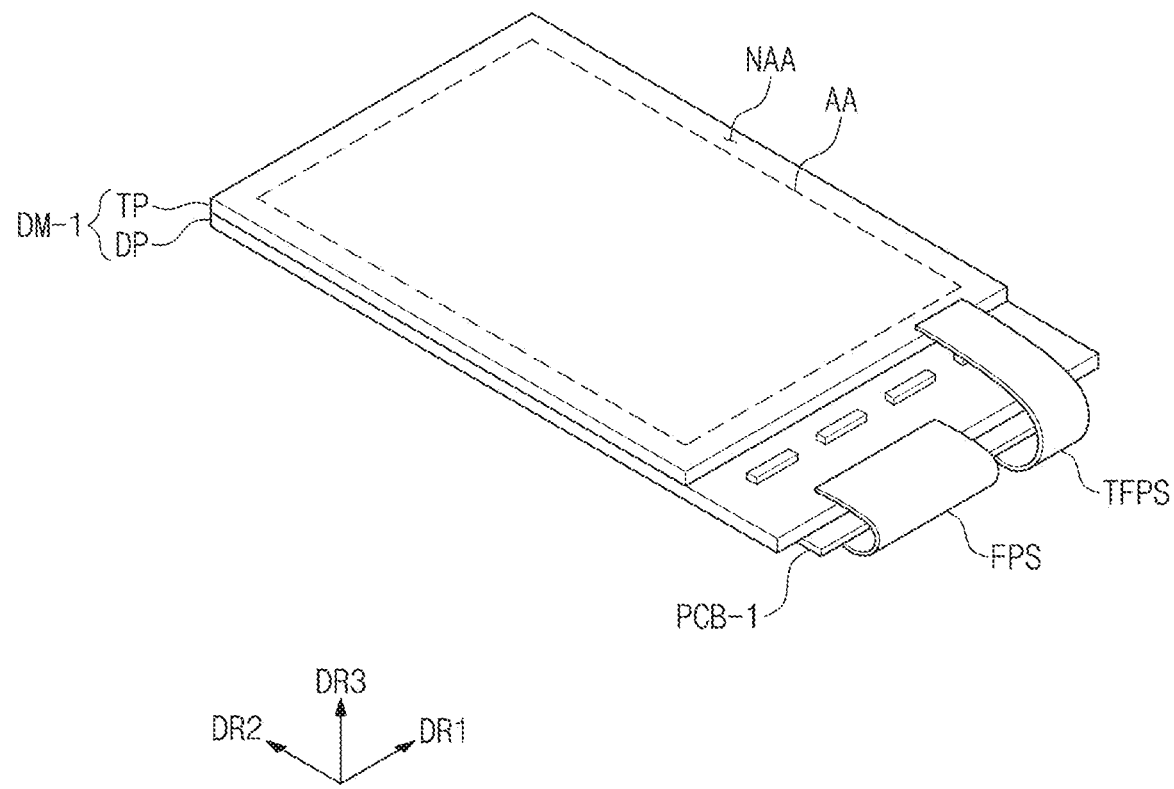
Figure 13:
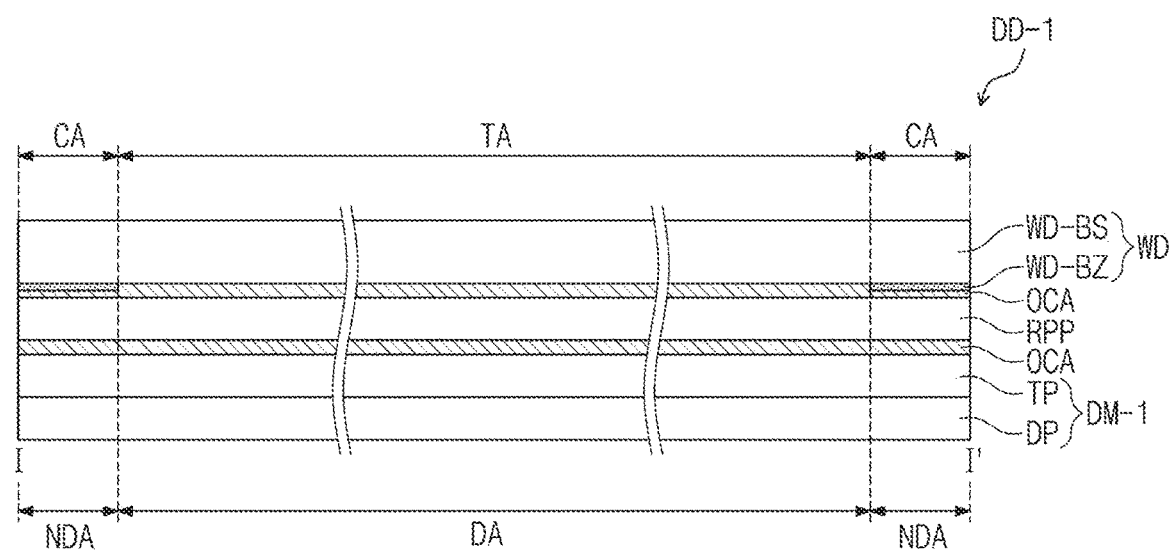
FIG. 13 is a sectional view illustrating a display device including the display module of FIGS. 11 and 12.
Figure 13:
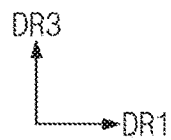

FIGS. 11 and 12 are perspective views, each of which illustrates a display module and a printed circuit board according to an exemplary embodiment of the inventive concepts. FIG. 13 is a sectional view illustrating a display device including the display module of FIGS. 11 and 12.

For concise description, a previously described element may be identified by the same reference number without repeating an overlapping description thereof. Other elements that are not separately described may be configured to have substantially the same technical features as those in the previously described exemplary embodiments.

Referring to FIGS. 11 to 13, a display module DM-1 according to an exemplary embodiment of the inventive concepts may further include an input sensing panel TP. The input sensing panel TP may be provided between the display panel DP and the anti-reflection panel RPP. The input sensing panel TP and the display panel DP may be provided to form a laminated structure.

In the present exemplary embodiment, the input sensing panel TP may be provided to be overlapped with the entire region of the display panel DP, except the pad region PAD (e.g., see FIG. 3). In other words, the input sensing panel TP may have a size or area smaller than the display panel DP. However, the inventive concepts are not limited to a specific size of the input sensing panel TP.

The input sensing panel TP may include an active region AA and a non-active region NAA surrounding the active region AA. The active region AA may correspond to the display region DA of the display panel DP, and the non-active region NAA may correspond to the non-display region NDA of the display panel DP, except the pad region PAD.

The input sensing panel TP may be configured to sense an input signal input from the outside. The input signal may include various types of input provided from the outside of the display device. For example, the input signal may include various types of external inputs, such as a part of a user's body, light, heat, or pressure. In the present exemplary embodiment, the input signal may be a touch signal.

The input sensing panel TP may be configured to sense an input signal provided on at least one of the active region AA and the non-active region NAA. For the sake of simplicity, the description that follows will refer to an example in which the input sensing panel TP is configured to sense only an input signal provided on the active region AA, but the inventive concepts are not limited thereto.

In the present exemplary embodiment, the active region AA may be a region, where an input signal is sensed. Although not shown, the input sensing panel TP may be provided on the active region AA, and the input sensing panel TP may include a plurality of sensing electrodes, which are used to sense an input signal.

In the present exemplary embodiment, a plurality of flexible substrates FPS and TFPS may be provided. The plurality of flexible substrates FPS and TFPS may include a first flexible substrate FPS and a second flexible substrate TFPS. The first flexible substrate FPS may be provided to connect the display panel DP to a printed circuit board PCB-1. The first flexible substrate FPS may be configured to have substantially the same features as those of the flexible substrate FPS described with reference to FIGS. 1 to 10, and a detailed description thereof will be omitted.

The second flexible substrate TFPS may be configured to connect the input sensing panel TP to the printed circuit board PCB-1. For example, an end of the second flexible substrate TFPS may be connected to the input sensing panel TP, and an opposite end of the second flexible substrate TFPS may be connected to the printed circuit board PCB-1. Although not shown, a plurality of substrate pad regions may be defined in the printed circuit board PCB-1 according to the present exemplary embodiment, and the opposite end of the second flexible substrate TFPS may be coupled to one of the plurality of substrate pad regions.

Except for the difference in connection position of the second flexible substrate TFPS, the second flexible substrate TFPS may be configured to be substantially the same as the afore-described first flexible substrate FPS in terms of sectional structure and arrangement of elements, and thus, a detailed description thereof will be omitted.

Figure 14:
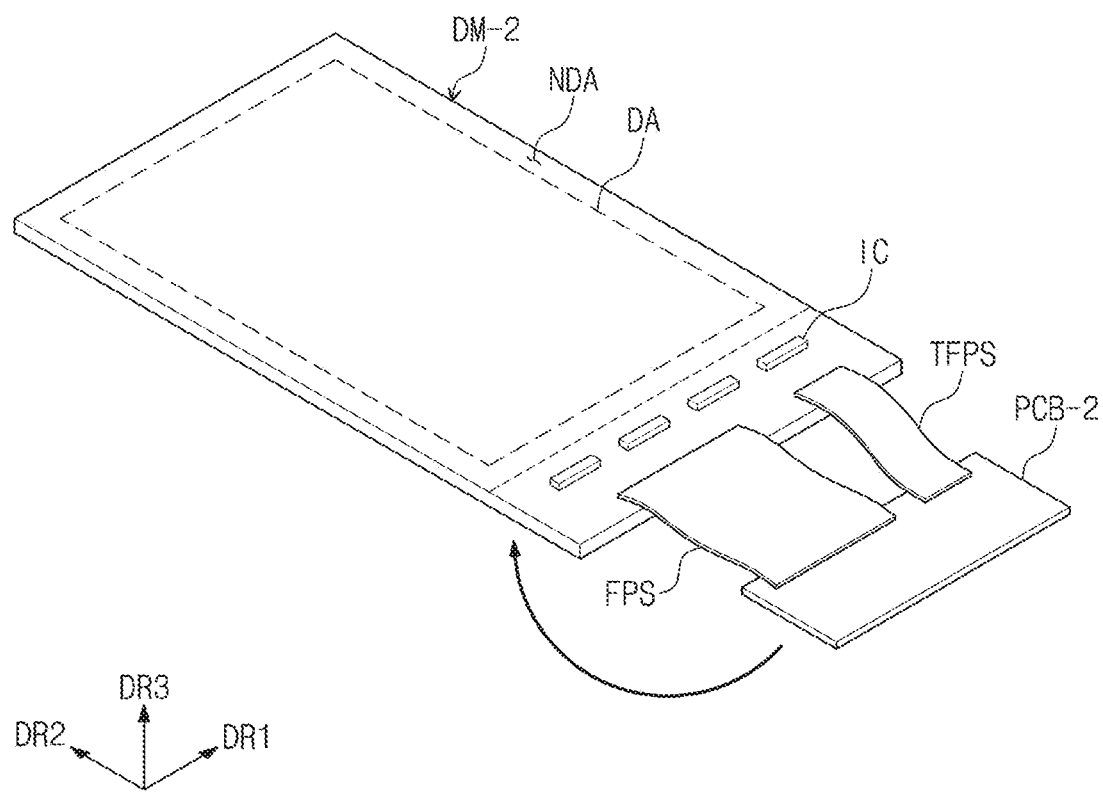
FIG. 14 is a perspective view illustrating a display module and a printed circuit board, according to an exemplary embodiment of the inventive concepts.

FIG. 14 is a perspective view illustrating a display module and a printed circuit board, according to an exemplary embodiment of the inventive concepts.

For concise description, a previously described element may be identified by the same reference number without repeating an overlapping description thereof. Other elements that are not separately described may be configured to have substantially the same technical features as those in the previously described exemplary embodiments.

Furthermore, a display module DM-2 of FIG. 14 may be configured to have substantially the same sectional structure as that of the display module DM-1 of FIG. 12, and thus, the sectional structure of the display module DM-2 of FIG. 14 will be described with reference to FIG. 12. For concise description, an element previously described with reference to FIG. 12 may be identified by the same reference number without repeating an overlapping description thereof.

Referring to FIGS. 14 and 12, the display module DM-2 according to an exemplary embodiment of the inventive concepts may be configured not only to sense an input signal provided from the outside, but also to display an image. In other words, the display module DM-2 according to the present exemplary embodiment may be provided as a single element, in which the display panel DP and the input sensing panel TP previously described with reference to FIGS. 11 to 13 are integrated.

For example, the display module DM-2 according to the present exemplary embodiment may include the display region DA and the non-display region NDA. The display region DA may be configured to display an image, whereas the non-display region NDA may not be used to display an image. At least one of the display and non-display regions DA and NDA may be configured to sense an input signal provided from the outside of the display module DM-2.

The display module DM-2 may include a display layer DP and an input sensing layer TP, which is provided on the display layer DP. The display layer DP may include a plurality of organic light emitting devices for the pixels, which are used to display an image. The input sensing layer TP may include a plurality of sensing electrodes, which are used to sense an input signal.

In the present exemplary embodiment, a plurality of flexible substrates FPS and TFPS may be provided. The plurality of flexible substrates FPS and TFPS may include the first flexible substrate FPS and the second flexible substrate TFPS. An end of each of the first and second flexible substrates FPS and TFPS may be connected to a pad region (e.g., see FIG. 3) that is defined in an edge region of the display module DM-2. Although not shown, the display module DM-2 may include a plurality of panel pad regions (e.g., see the panel pad region BAD in FIG. 3), and the first flexible substrate FPS and the second flexible substrate TFPS may be coupled to the panel pad regions, respectively, in a one-to-one connection manner. In the present exemplary embodiment, the first flexible substrate FPS and the second flexible substrate TFPS may not be stacked in a vertical or third direction DR3 and may be arranged side-by-side in a horizontal direction (e.g., the first direction DR1).

Figure 15:
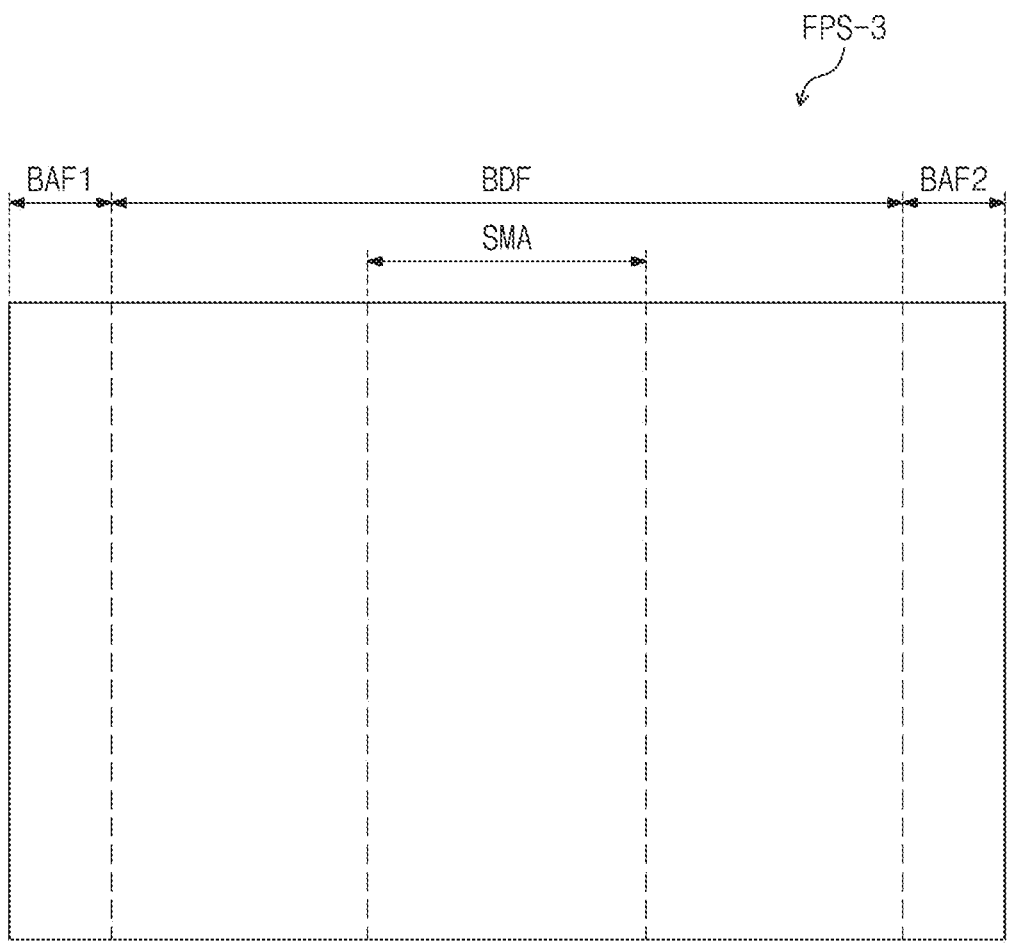
FIG. 15 is a plan view illustrating a flexible substrate according to an exemplary embodiment of the inventive concepts.
Figure 16:
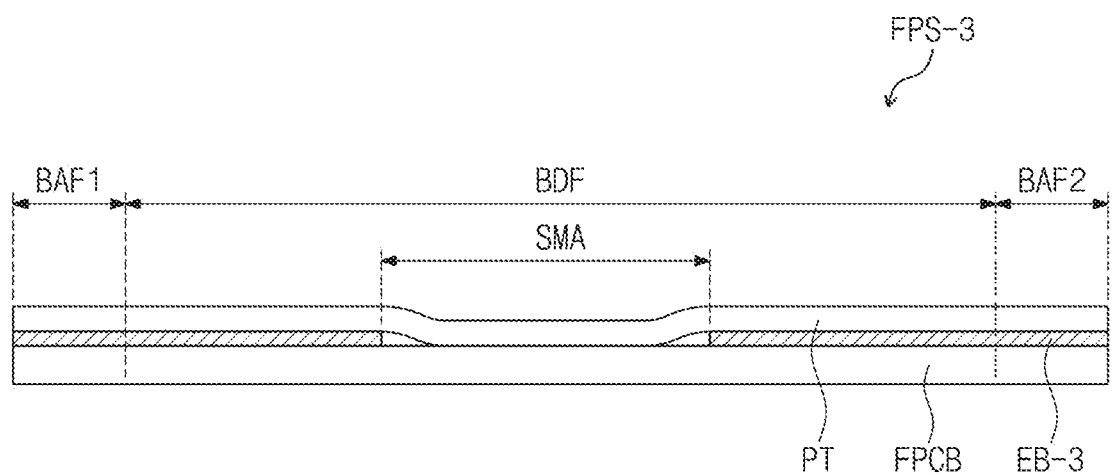
FIG. 16 is a sectional view of the flexible substrate of FIG. 15.
Figure 17:
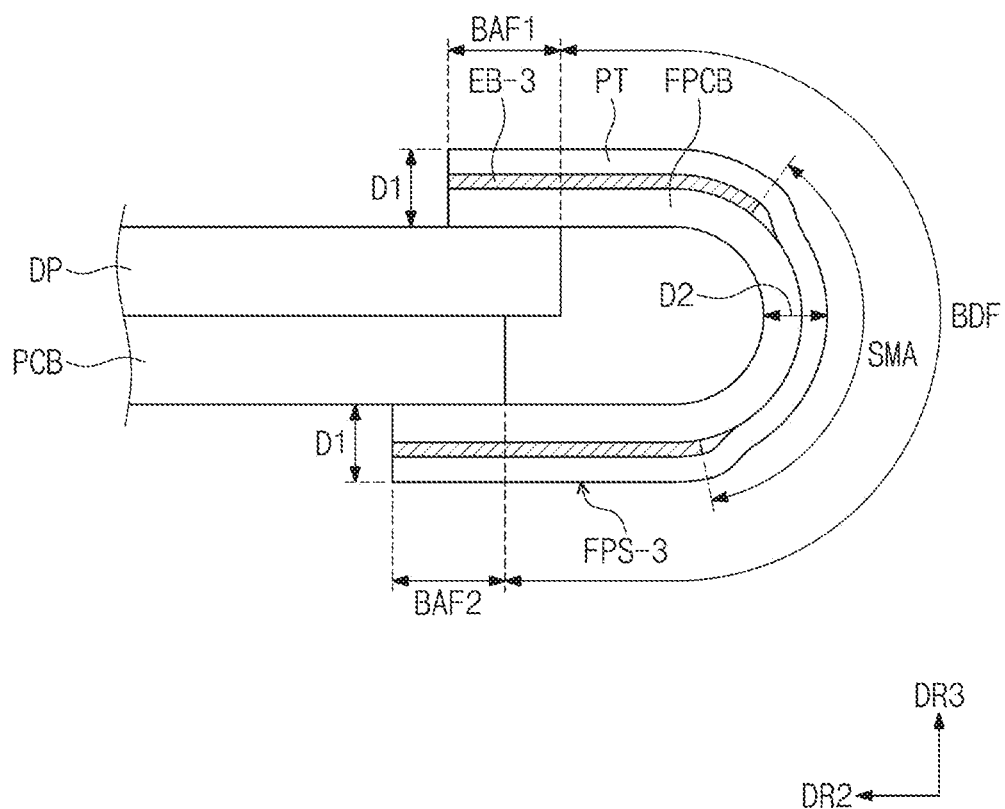
FIG. 17 is a sectional view illustrating a bent shape of the flexible substrate of FIG. 15.

FIG. 15 is a plan view illustrating a flexible substrate according to an exemplary embodiment of the inventive concepts, and FIG. 16 is a sectional view of the flexible substrate of FIG. 15. FIG. 17 is a sectional view illustrating a bent shape of the flexible substrate of FIG. 15.

For concise description, a previously described element may be identified by the same reference number without repeating an overlapping description thereof. Other elements that are not separately described may be configured to have substantially the same technical features as those in the previously described exemplary embodiments.

Referring to FIGS. 15 to 17, a flexible substrate FPS-3 according to an exemplary embodiment of the inventive concepts may include the first bonding region BAF1, the bending region BDF, and the second bonding region BAF2. The bending region BDF may include a maximum stress region SMA, which is defined in at least a portion of the bending region BDF. The maximum stress region SMA may be a region, on which a bending stress is maximally concentrated, when the flexible substrate FPS-3 is bent. For example, the maximum stress region SMA may be defined near a center of the bending region BDF.

In the present exemplary embodiment, the flexible substrate FPS-3 may include a bubble-prevention layer EB-3, which is provided to cover the entire top surface of the circuit layer FPCB, except the maximum stress region SMA. That is, the bubble-prevention layer EB-3 may not be overlapped with the maximum stress region SMA. Thus, the flexible substrate FPS-3 may have the second thickness D2 in the maximum stress region SMA and may have the first thickness D1 in the remaining region, except the maximum stress region SMA.

In the present exemplary embodiment, it may be possible to reduce a bending stress exerted on the flexible substrate FPS-3 and to increase an adhesion strength between the circuit layer FPCB and the cover layer PT.

Figure 18:
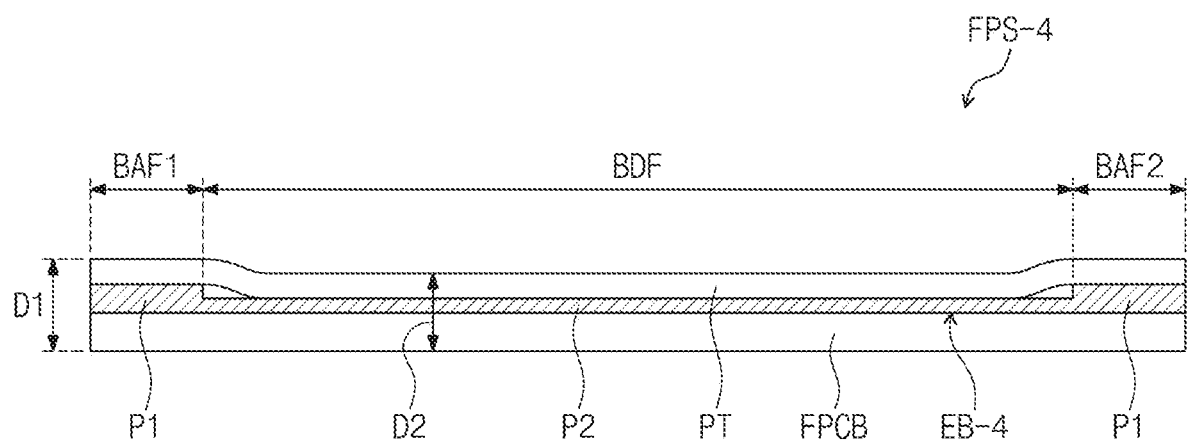
FIG. 18 is a sectional view illustrating a flexible substrate according to an exemplary embodiment of the inventive concepts.

FIG. 18 is a sectional view illustrating a flexible substrate according to an exemplary embodiment of the inventive concepts.

For concise description, a previously described element may be identified by the same reference number without repeating an overlapping description thereof. Other elements that are not separately described may be configured to have substantially the same technical features as those in the previously described exemplary embodiments.

In an exemplary embodiment, a bubble-prevention layer EB-4 of a flexible substrate FPS-4 may include first portions P1 and a second portion P2. The first portions P1 may be provided to have a one-to-one relation with the first and second bonding regions BAF1 and BAF2. The first portions P1 may be spaced apart from each other with the bending region BDF interposed therebetween. The second portion P2 may be provided on the bending region BDF. The second portion P2 may connect the first portions P1 to each other. In other words, the bubble-prevention layer EB-4 may be provided in the form of a single body.

In the present exemplary embodiment, a thickness of the second portion P2 may be smaller than a thickness of the first portion P1. For example, the thickness of the first portion P1 may range from about 25 μm to about 35 μm, and the thickness of the second portion P2 may not be limited to a specific value, if the thickness of the second portion P2 is within a range smaller than the thickness of the first portion P1.

In the present exemplary embodiment, since a thickness of the bending region BDF of the flexible substrate FPS-4 is smaller than a thickness of each of the first and second bonding regions BAF1 and BAF2 of the flexible substrate FPS-4, it may be possible to reduce a bending stress, which is exerted on the bending region BDF when the flexible substrate FPS-4 is bent.

Figure 19:
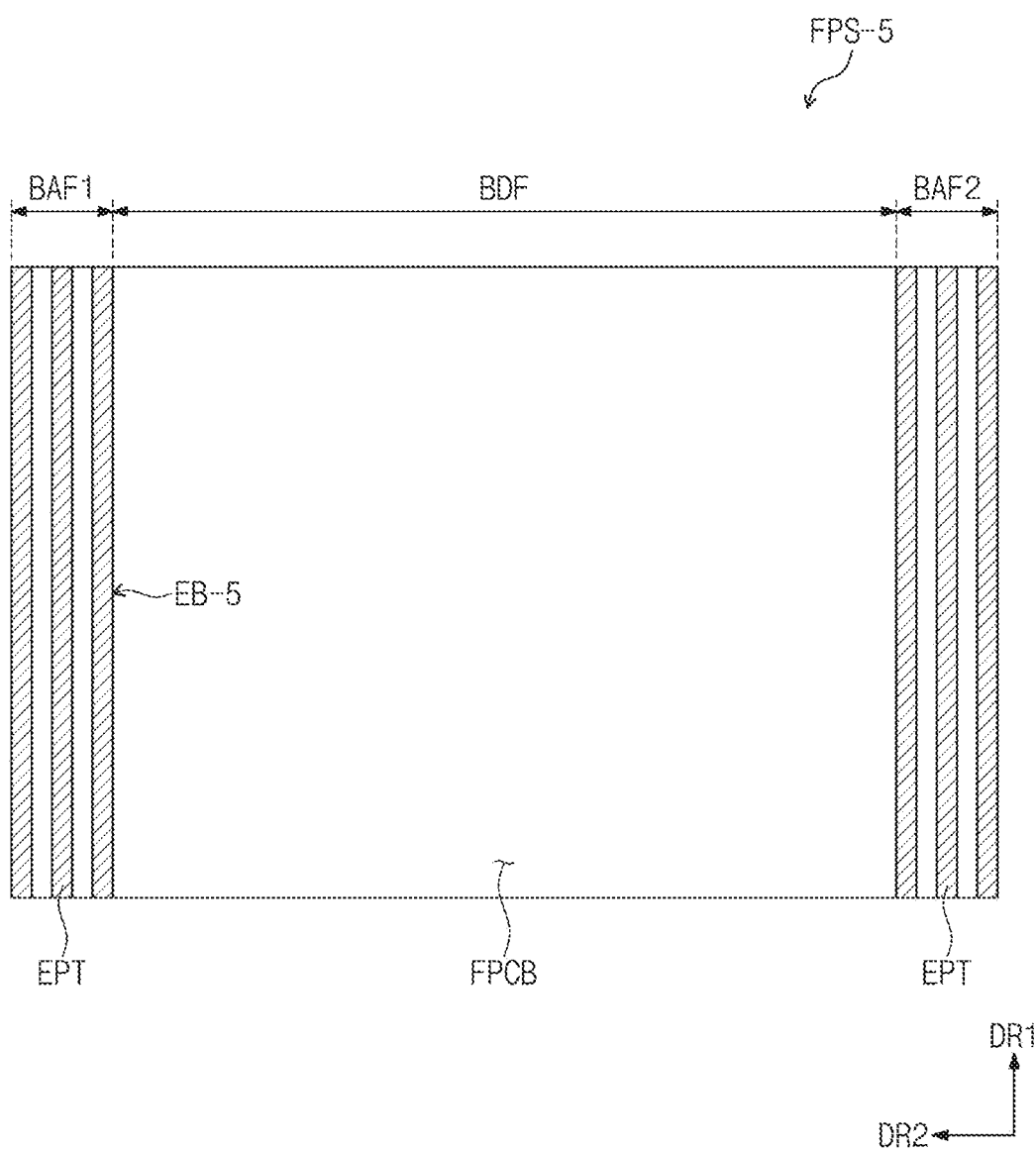
FIG. 19 is a plan view illustrating a flexible substrate according to an exemplary embodiment of the inventive concepts.
Figure 20:
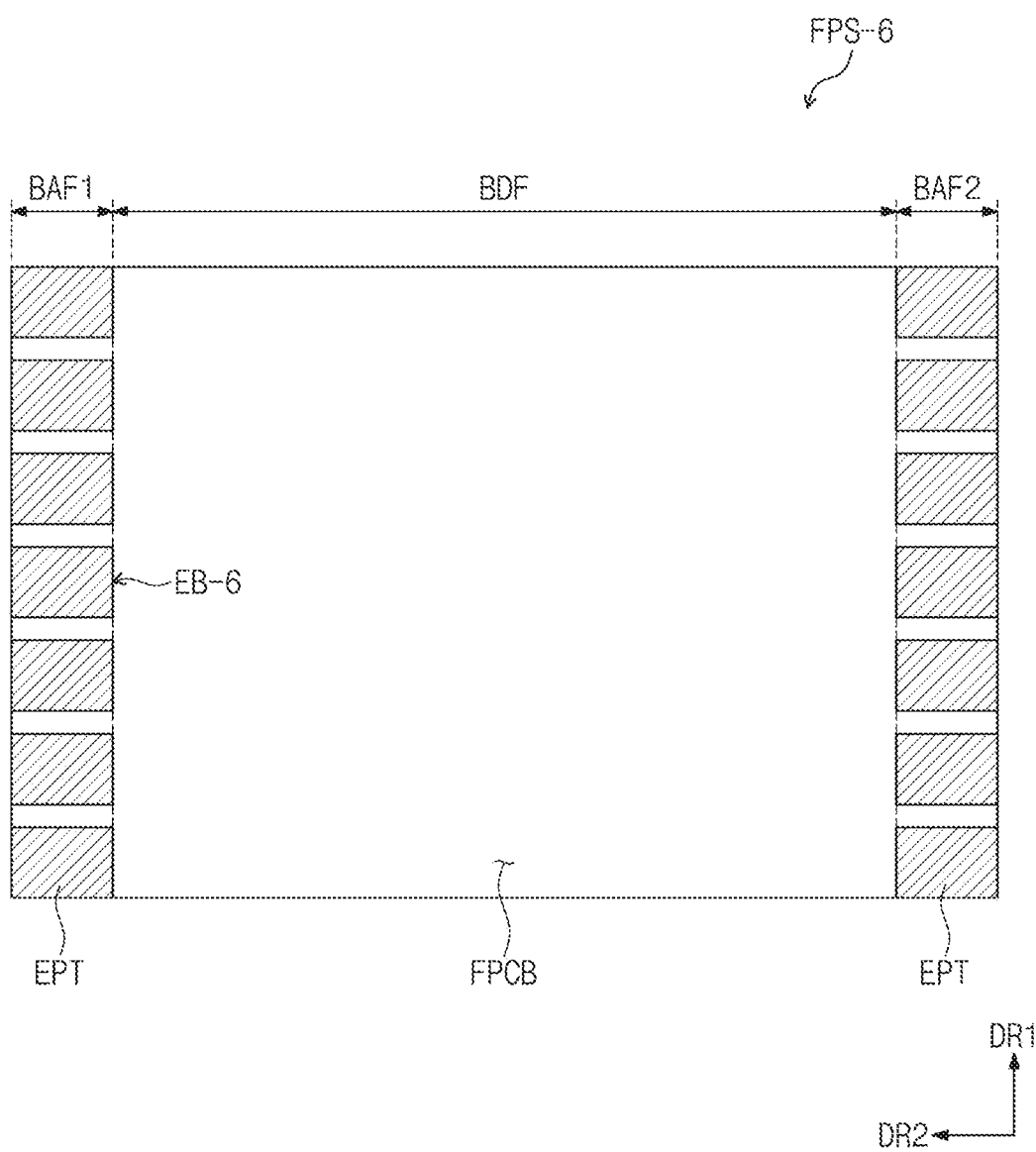
FIG. 20 is a plan view illustrating a flexible substrate according to an exemplary embodiment of the inventive concepts.

FIGS. 19 and 20 are plan views, each of which illustrates a flexible substrate according to an exemplary embodiment of the inventive concepts.

For concise description, a previously described element may be identified by the same reference number without repeating an overlapping description thereof. Other elements that are not separately described may be configured to have substantially the same technical features as those in the previously described exemplary embodiments.

Referring to FIGS. 19 and 20, a flexible substrate FPS-5 or FPS-6 may include a bubble-prevention layer EB-5 or EB-6 including a plurality of bubble-prevention patterns EPT. The bubble-prevention patterns EPT may be provided in the first and second bonding regions BAF1 and BAF2 and may be spaced apart from each other in each of the first and second bonding regions BAF1 and BAF2.

As shown in FIG. 19, each of the bubble-prevention patterns EPT of the bubble-prevention layer EB-5 may have a stripe shape. For example, the bubble-prevention patterns EPT may extend in the first direction DR1 and may be arranged to be spaced apart from each other in the second direction DR2.

By contrast, as shown in FIG. 20, the bubble-prevention patterns EPT of the bubble-prevention layer EB-6 may be arranged to be spaced apart from each other in the first direction DR1.

The shapes and arrangement of the bubble-prevention patterns EPT may not be limited to the examples shown in FIGS. 19 and 20 and may be variously changed, if bubbles, which are produced between the circuit and cover layers FPCB and PT (e.g., see FIG. 8), can be effectively exhausted to the outside through a space between the bubble-prevention patterns EPT.

Furthermore, although not illustrated in the drawings, the bubble-prevention patterns EPT may also be provided in at least a portion of the bending region BDF, except the afore-described maximum stress region SMA (e.g., see FIG. 15). In this case, it may be possible to increase a bonding force between the circuit and cover layers FPCB and PT (e.g., see FIG. 8) and to reduce a bending stress exerted on the flexible substrate FPS.

According to some exemplary embodiments of the inventive concepts, it may be possible to improve durability of a flexible substrate and a display device including the same.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a display module configured to display an image;
a printed circuit board disposed below the display module; and
a flexible substrate bent to connect the display module to the printed circuit board, the flexible substrate comprising a first bonding region, a bending region, and a second bonding region, which are arranged in a specific direction when viewed in a plan view,
wherein the first bonding region is connected to the display module,
the second bonding region is connected to the printed circuit board,
the bending region is defined between the first and second bonding regions to connect the first bonding region to the second bonding region, and
the flexible substrate comprises:
a circuit layer electrically connecting the display module to the printed circuit board;
a cover layer disposed on the circuit layer; and
a bubble-prevention layer configured to move bubbles and exhaust them away from the flexible substrate, the bubble-prevention layer disposed between the cover layer and the circuit layer and configured to overlap with each of the first and second bonding regions,
wherein the bubble-prevention layer comprises a fine pattern formed on at least one surface contacting the cover layer or the circuit layer, the fine pattern comprising a plurality of protrusions and a space defined by gaps, dents, or grooves between the protrusions configured to remove a bubble from the space,
wherein the display module includes a display region configured to display the image and a non-display region surrounding the display region,
the non-display region includes a pad region to which the printed circuit board is connected, and
the bubble-prevention layer overlaps the pad region, and the bubble-prevention layer does not overlap the display area.

2. The display device of claim 1, wherein the flexible substrate has a first thickness in each of the first and second bonding regions and has a second thickness, which is smaller than the first thickness, in at least a portion of the bending region.

3. The display device of claim 2, wherein the bubble-prevention layer comprises:
first portions configured to overlap with the first and second bonding regions, respectively, and spaced apart from each other with the bending region interposed therebetween; and
a second portion disposed between the first portions and configured to overlap with the bending region, and
the second portion is thinner than each of the first portions.

4. The display device of claim 2, wherein the cover layer and the circuit layer are disposed in direct contact with each other in the bending region.

5. The display device of claim 4, wherein the bubble-prevention layer is configured to not overlap with the bending region.

6. The display device of claim 2, wherein the bending region comprises a maximum stress region, and
a thickness of the flexible substrate is smaller in the maximum stress region than in other regions of the bending region.

7. The display device of claim 6, wherein the bubble-prevention layer is configured to overlap with a region on the flexible substrate other than the maximum stress region.

8. The display device of claim 1, wherein the bubble-prevention layer comprises a plurality of bubble-prevention patterns disposed in each of the first and second bonding regions.

9. The display device of claim 8, wherein the bubble-prevention patterns are arranged to have a stripe shape on each of the first and second bonding regions.

10. The display device of claim 9, wherein the bubble-prevention patterns extend in a direction perpendicular to the specific direction.

11. The display device of claim 9, wherein the bubble-prevention patterns are arranged in a direction perpendicular to the specific direction.

12. The display device of claim 1, wherein the cover layer comprises an electromagnetic interference shielding layer.

13. The display device of claim 1, wherein the cover layer comprises a metallic material.

14. The display device of claim 1, wherein the cover layer comprises a protection layer disposed to protect the circuit layer.

15. The display device of claim 1, wherein the flexible substrate comprises a plurality of flexible substrates, and
at least one of the plurality of flexible substrates is configured to provide an input signal, which is provided to the display module from an outside of the display module, to the printed circuit board.

16. The display device of claim 15, wherein the display module comprises:
a display layer comprising a plurality of organic light emitting devices; and
an input sensing layer disposed on the display layer, the input sensing layer comprising a plurality of sensing electrodes configured to sense the input signal, and
the flexible substrates are arranged side-by-side on a same surface of the display module.

17. The display device of claim 15, wherein the display module comprises:
a display panel configured to display the image; and
an input sensing panel disposed on the display panel, wherein the input sensing panel comprises a plurality of sensing electrodes configured to sense the input signal.

18. The display device of claim 17, wherein the plurality of flexible substrate comprises:
a first flexible substrate configured to connect the display panel to the printed circuit board; and
a second flexible substrate configured to connect the input sensing panel to the printed circuit board.

19. The display device of claim 1, wherein a thickness of the bubble-prevention layer ranges from about 25 μm to about 35 μm.

20. The display device of claim 1, wherein a thickness of the cover layer ranges from about 25 μm to about 35 μm.

21. A display device, comprising:
a display module configured to display an image;
a printed circuit board disposed below the display module; and
a flexible substrate comprising two opposite ends that are connected to the display module and the printed circuit board, respectively,
wherein the flexible substrate comprises:
a circuit layer comprising two opposite ends, which are in contact with the display module and the printed circuit board, respectively, thereby connecting the display module electrically to the printed circuit board;
a bubble-prevention layer configured to move bubbles and exhaust them away from the flexible substrate, the bubble-prevention layer disposed on the two opposite ends of the circuit layer; and
a cover layer disposed on the circuit layer and the bubble-prevention layer to cover the circuit layer and the bubble-prevention layer,
wherein at least a portion of the flexible substrate positioned between the two opposite ends of the flexible substrate is bent to form a bent portion, and
wherein a thickness of the bent portion of the flexible substrate is smaller than a thickness of each of the two opposite ends of the flexible substrate,
wherein the bubble-prevention layer comprises a fine pattern formed on at least one surface contacting the cover layer or the circuit layer, the fine pattern comprising a plurality of protrusions and a space defined by gaps, dents, or grooves between the protrusions configured to remove a bubble from the space,
wherein the display module includes a display region configured to display the image and a non-display region surrounding the display region,
the non-display region includes a pad region to which the printed circuit board is connected, and
the bubble-prevention layer overlaps the pad region, and the bubble-prevention layer does not overlap the display area.

22. The display device of claim 21, wherein the bubble-prevention layer is configured to increase an adhesion strength between the circuit layer and the cover layer.

23. A display device, comprising:
a display module configured to display an image;
a printed circuit board disposed below the display module; and
a flexible substrate comprising at least one bent portion to connect the display module to the printed circuit board,
wherein the flexible substrate comprises:
a circuit layer comprising a plurality of signal lines;
a bubble-prevention layer configured to move bubbles and exhaust them away from the flexible substrate, the bubble-prevention layer comprising a pair of patterns, which are provided at two opposite ends of the flexible substrate and are spaced apart from each other; and
a cover layer disposed on the circuit layer and the bubble-prevention layer to cover the circuit layer and the bubble-prevention layer,
wherein the bubble-prevention layer comprises a fine pattern formed on at least one surface contacting the cover layer or the circuit layer, the fine pattern comprising a plurality of protrusions and a space defined by gaps, dents, or grooves between the protrusions configured to remove a bubble from the space,
wherein the display module includes a display region configured to display the image and a non-display region surrounding the display region,
the non-display region includes a pad region to which the printed circuit board is connected, and
the bubble-prevention layer overlaps the pad region, and the bubble-prevention layer does not overlap the display area.

24. The display device of claim 23, wherein the circuit layer and the cover layer are disposed in direct contact with each other in the at least one bent portion of the flexible substrate.

25. The display device of claim 23, wherein the cover layer comprises a metallic material.

26. A flexible substrate for a display module, comprising:
a circuit layer comprising a plurality of signal lines and having a flexible property;
a cover layer disposed on the circuit layer; and
a bubble-prevention layer configured to move bubbles and exhaust them away from the flexible substrate, the bubble-prevention layer disposed between the cover layer and the circuit layer, wherein:
the circuit layer comprises bonding regions, which are electrically coupled to a printed circuit board or driving devices, and a bending region, which is at least partially bent,
the bubble-prevention layer is disposed on the bonding regions,
a thickness of the flexible substrate is greater in the bonding regions than in the bending region, and
the bubble-prevention layer comprises a fine pattern formed on at least one surface contacting the cover layer or the circuit layer, the fine pattern comprising a plurality of protrusions and a space defined by gaps, dents, or grooves between the protrusions configured to remove a bubble from the space,
wherein the display module includes a display region configured to display the image and a non-display region surrounding the display region,
the non-display region includes a pad region to which the printed circuit board is connected, and
the bubble-prevention layer overlaps the pad region, and the bubble-prevention layer does not overlap the display area.

* * * * *